United States Patent [19]
Drews et al.

[11] 3,993,909

[45] Nov. 23, 1976

[54] SUBSTRATE HOLDER FOR ETCHING THIN FILMS

[75] Inventors: Klaus Drews, Halstenbek; Jens-Peter Krumme, Hamburg, both of Germany

[73] Assignee: U.S. Philips Corporation, New York, N.Y.

[22] Filed: Dec. 24, 1975

[21] Appl. No.: 644,069

Related U.S. Application Data

[63] Continuation of Ser. No. 450,742, March 13, 1974, abandoned.

[30] Foreign Application Priority Data

Mar. 16, 1973  Germany............................ 2313096

[52] U.S. Cl............................... 250/492 A; 250/442
[51] Int. Cl.² ......................................... H01J 37/00
[58] Field of Search............ 250/492 A, 492 B, 491, 250/310, 442

[56] References Cited
UNITED STATES PATENTS

| | | | |
|---|---|---|---|
| 3,388,099 | 6/1968 | King............................... | 250/492 A |
| 3,496,029 | 2/1970 | King et al....................... | 250/492 A |
| 3,497,689 | 2/1970 | Helwig et al.................... | 250/311 |
| 3,629,577 | 12/1971 | Weber et al..................... | 250/442 |
| 3,648,048 | 3/1972 | Cahan et al..................... | 250/492 A |
| 3,689,766 | 12/1972 | Freeman......................... | 250/492 A |
| 3,778,626 | 12/1973 | Robertson....................... | 250/492 A |

FOREIGN PATENTS OR APPLICATIONS 1,104,106  2/1968  United Kingdom

*Primary Examiner*—Alfred E. Smith
*Attorney, Agent, or Firm*—Frank R. Trifari; Ronald L. Drumheller

[57] ABSTRACT

Substrate holder for etching thin films by means of an ion beam in which a driving device moves the surface of a substrate placed on a turntable with respect to the ion beam, which holder includes a friction disk which rotates in rolling contact with a surface of a driving disk carrying the turntable and is spaced from the axis of the driving disk by a distance equal to that at which the point of impact of the ion beam on the substrate is located.

3 Claims, 1 Drawing Figure

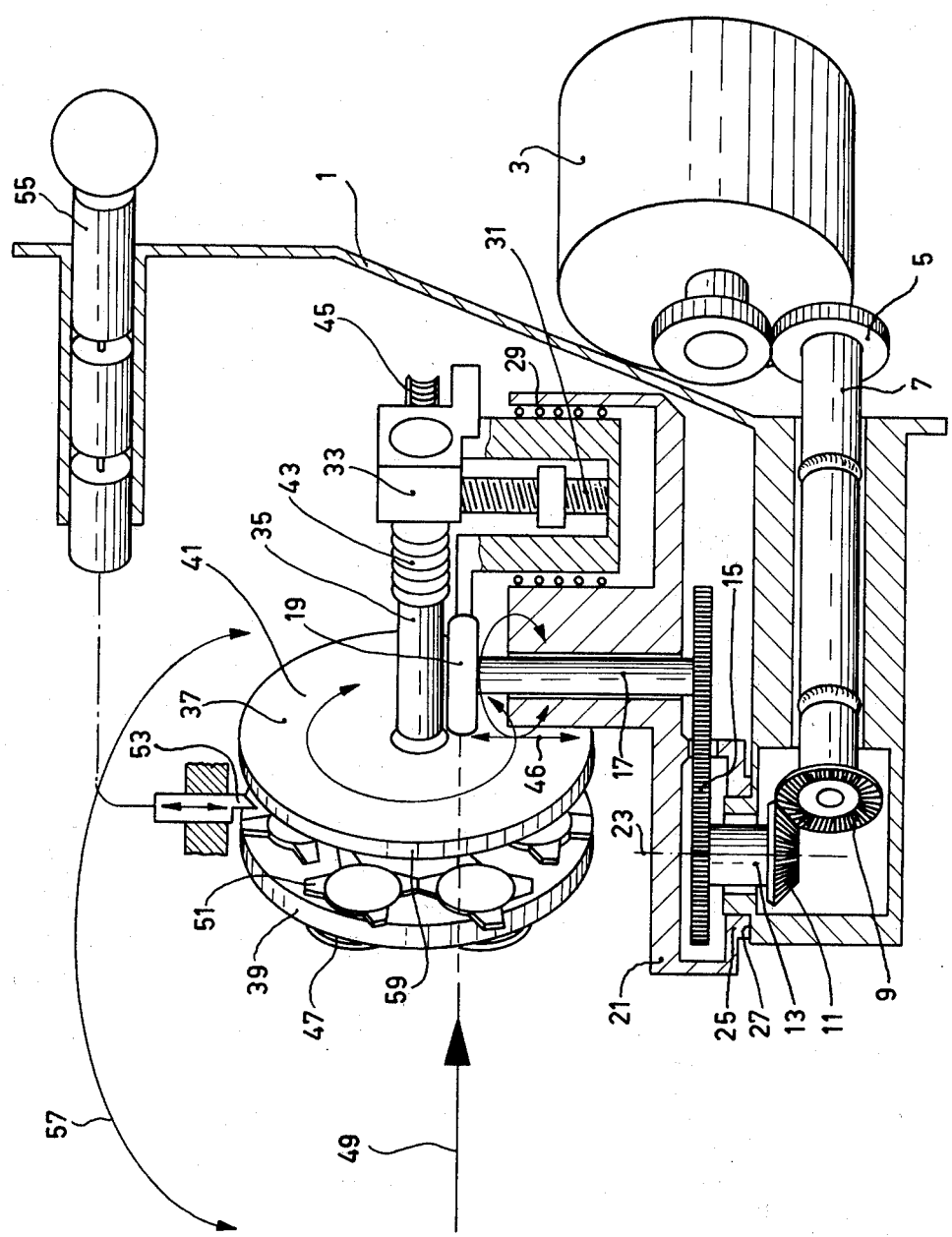

SUBSTRATE HOLDER FOR ETCHING THIN FILMS

This is a continuation of application Ser. No. 450,742, filed Mar. 13, 1974 abandoned.

The invention relates to a substrate holder for etching thin films by means of an ion beam, which holder is provided with a driving device adapted to move a substrate placed on a turntable with respect to the ion beam.

Ion etching of surface structures in layers locally covered by masks between two electrodes (back-sputtering or sputter-etching) yield etched structures having edges lacking in steepness. By contrast, etching by means of a beam of collimated ions provides steep edges and permits etching geometries of a few microns with structure depths of several microns (see E. G. Spencer and P. H. Schmidt, Journal of Vacuum Science Technology 8, page 52 (1971)). Because the conventional ion beam guns emit ion beams of less than 2 mm in diameter, a film having transverse dimensions exceeding those of the beam are to be moved to enable their surfaces to be uniformly etched.

Substrate holders capable of translatory and rotary motions are known. The apparatus generally referred to as "Schuur's Pendulum" which is marketed by the firm of Balzers of Liechtenstein, however, does not produce plane surfaces, because the two motions are independent of one another.

In the "Reciprocating Specimen Holder" marketed by Commonwealth Scientific, Virginia, USA, the two motions are made dependent upon one another by a disk cam control system, although the drives are separate. However, this apparatus also does not enable the film thickness to be maintained within the tolerances of ± 0.1 micron required for some uses.

It is an object of the present invention to provide a substrate holder which enables the film thickness to be maintained within the narrow permissible tolerances.

For this purpose a substrate holder according to the invention is characterized by a friction disk which is adapted to rotate in rolling contact with a face of the turntable or of a driving disk carrying the turntable and which is spaced from the shaft of the driving disk by a radial distance equal to the radial distance by which the point of impact of the ion beam on the substrate is spaced therefrom.

When the ion beam always impinges on the substrate at the location at which the friction disk runs on the driving disk, the feed of the substrate and the time of action of the ion beam always are in the same ratio. This means that the ion beam always acts on each area of the substrate in the same manner, irrespective of whether this area of the substrate is near the driving disk shaft or remote therefrom. This ensures uniform etching.

In another embodiment of the invention the shaft of the driving disk is supported for rotation in a nut which is displaceable by means of a lead screw which extends at right angles to the shaft and is rotatable by means of the shaft via a drive, the nut being displaced in the direction of length of the lead screw. Thus the rotating driving disk is displaced in a vertical direction at right angles to the shaft. This dispenses with the need for an additional drive.

The known apparatus furthermore lacks a capability of motion which is of importance for ion etching of structures with the aid of masks. This motion is a rotation of the substrate about a second axis parallel to the first mentioned axis. Hence in a further embodiment of the invention the turntable carries supports for the substrates, each support being intermittently rotatable about its axis, which extends parallel to the driving shaft, by means of a sprocket wheel during rotation of the driving disk. The supports carrying the substrates preferably are evenly distributed on the turntable at equal distances from the turntable axis. Preferably a pawl may be made to engage with the sprocket wheels of the supports.

To achieve steep edges it further is important that the angle of incidence of the ion beam with respect to the normal to the film to be etched is different from zero. Thus the ion beam is required to successively pass through all directions on the curved surface of a cone having a vertical angle equal to the angle of incidence in order to avoid "shadow action" of the edges of the film structure. For this purpose in a further embodiment of the invention the turntable together with the driving disk and at least part of the driving device is rotatable about an axis that coincides with the vertical passing through the center of the turntable.

An embodiment of the invention will now be described, by way of example, with reference to the accompanying diagrammatic drawing.

Referring now to the single FIGURE of the drawing, there is shown a frame 1 on which is mounted a motor 3 which drives a shaft 7 via a gearing 5. The shaft 7, which also is journalled in the frame 1, carries a bevel gearwheel 9 which meshes with a second bevel gearwheel 11 on a transmission shaft 13. Via a gearing 15 the shaft 13 drives a shaft 17 on which is mounted a friction disk 19. The shaft 17 is journalled in a casing 21 which is pivotable through at least 90° about the axis 23 of the shaft 13. For this purpose a ring 25 of the casing 21 rests on a shoulder 27 of the frame 1.

The casing has a guide 29 in which a lead screw 31 is mounted for rotation. The lead screw 31 carries a nut 33 in which a shaft 35 is journalled to which are secured, in spaced parallel relationship, a driving disk 37 and a turntable 39 for substrate supports. The friction disk 19 runs on a face 41 of the driving disk 37. Thus the friction disk 19 rotates the disk 37 and hence the turntable 39 and the shaft 35. Rotation of the shaft 35 causes a worm 43 to drive a wormwheel 45 which rotates the lead screw 31. Thus the shaft 35 together with the disk 37 and the turntable 39 are raised and lowered in the directions indicated by a double-headed arrow 46.

The turntable 39 carries supports 47 for substrates. The supports 47 are evenly distributed on the turntable 39 at equal radial distances from the shaft 35.

To remove material from the substrates an ion beam 49 is directed onto the substrates. The ion beam 49 extends in the plane of the friction disk 19 so as to impinge on the substrates mounted on the supports 47. During the vertical reciprocating movements of the supports 47 due to the raising and lowering of the shaft 35 the material of the substrates is evenly removed.

A further capability of motion is given in that sprocket wheels 51 are secured to the supports 47. When the disk 37 and the turntable 39 rotate the sprocket wheels 51 may intermittently be rotated by means of a pawl 53 which may be caused at will to engage these wheels. The pawl 53 may be moved into, or retracted from, the path of a sprocket wheel 51 at will by means of a control device 55.

A double-headed arrow 57 indicates a further capability of motion of the substrates. By means of a device, not shown, the casing 21 can perform the aforementioned pivotal movement about the axis 23. This axis is in line with the vertical 59 passing through the centre of the turntable 39.

In the substrate holder according to the invention the dwell time of the ion beam at each location of a substrate is equal, which means uniform etching. To find the best angle of incidence of the ion beam on the substrates the casing 21 is pivoted about the axis 23 through an angle such that the surface of the substrate contains the axis 23.

The apparatus may be extended in that, in addition to the coupled motions, the translation and rotation of the turntable and the substrate support may also be separately controlled so as to enable the substrates to be etched via motor pulses only.

When combined with an ion beam source and a photolithographic masking technique the invention enables manufacture of plane surfaces having groove structures of high edge steepness (equal to or greater than 80°), high lateral resolution (more than 700 lines/mm) and large groove depth (more than 3 microns). In addition, in principle plane-parallel films are obtainable with a thickness tolerance of less than 0.1 micron.

What is claimed is:

1. In a substrate holder of the type wherein a rotating turntable is adapted for carrying a plurality of substrates past an etching ion beam, the ion beam impacting the substrate surfaces at a gradually varying radius from the rotation axis of the turntable, the rotation speed of the turntable being proportional to the gradually varying radius, the improvement comprising:
   a rotatable support for each substrate journalled in the turntable so that the surface of the substrate to be etched may be rotated within its own plane, the rotation axis of each support being parallel to the rotation axis of the turntable; and
   means for rotating each support by a fixed amount during each rotation of the turntable.

2. The improvement of claim 1 wherein the rotation axis of each support is placed from the rotation axis of the turntable by the same distance.

3. The improvement of claim 2 further characterized by a sprocket wheel coaxially attached to each support for rotating said support, said means for rotating each support by a fixed amount during each rotation of the turntable comprising a pawl adapted for contact with successive sprocket wheels during rotation of the turntable so that each sprocket wheel and the support carried thereby rotates by a fixed amount when said sprocket wheel passes said pawl.

* * * * *